US011695038B2

(12) United States Patent
Li et al.

(10) Patent No.: US 11,695,038 B2
(45) Date of Patent: Jul. 4, 2023

(54) FORMING SINGLE AND DOUBLE DIFFUSION BREAKS FOR FIN FIELD-EFFECT TRANSISTOR STRUCTURES

(71) Applicant: International Business Machines Corporation, Armonk, NY (US)

(72) Inventors: Juntao Li, Cohoes, NY (US); Kangguo Cheng, Schenectady, NY (US); Ruilong Xie, Niskayuna, NY (US); Junli Wang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 29 days.

(21) Appl. No.: 17/505,751

(22) Filed: Oct. 20, 2021

(65) Prior Publication Data
US 2022/0037194 A1 Feb. 3, 2022

Related U.S. Application Data

(62) Division of application No. 16/416,754, filed on May 20, 2019, now Pat. No. 11,195,745.

(51) Int. Cl.
*H01L 29/06* (2006.01)
*H01L 27/088* (2006.01)
*H01L 29/66* (2006.01)
*H01L 21/762* (2006.01)
(Continued)

(52) U.S. Cl.
CPC .... *H01L 29/0653* (2013.01); *H01L 21/76224* (2013.01); *H01L 21/823431* (2013.01); *H01L 21/845* (2013.01); *H01L 27/0886* (2013.01); *H01L 29/66545* (2013.01)

(58) Field of Classification Search
CPC ............ H01L 29/0653; H01L 27/0886; H01L 29/66545
See application file for complete search history.

(56) References Cited

U.S. PATENT DOCUMENTS 8,609,510 B1 12/2013 Banna et al.
8,846,491 B1 9/2014 Pham et al.
9,263,516 B1 2/2016 Wu et al.
(Continued)

OTHER PUBLICATIONS

Kangguo Cheng, "(Invited) FinFET Technology," ECS Transactions, Oct. 4, 2017, pp. 17-31, vol. 80, No. 4.
List of IBM Patents or Patent Applications Treated as Related.

*Primary Examiner* — Peter M Albrecht
(74) *Attorney, Agent, or Firm* — Samuel Waldbaum; Ryan, Mason & Lewis, LLP

(57) ABSTRACT

A method of forming a semiconductor structure includes forming a plurality of fins over a substrate, at least a portion of one or more of the fins providing one or more channels for one or more fin field-effect transistors. The method also includes forming a plurality of active gate structures over the fins, forming at least one single diffusion break trench between a first one of the active gate structures and a second one of the active gate structures, and forming at least one double diffusion break trench between a third one of the active gate structures and a fourth one of the active gate structures. The double diffusion break trench has a stepped height profile in the substrate, the stepped height profile comprising a first depth with a first width and a second depth less than the first depth with a second width greater than the first width.

20 Claims, 16 Drawing Sheets

(51) Int. Cl.
*H01L 21/8234* (2006.01)
*H01L 21/84* (2006.01)

(56) References Cited

U.S. PATENT DOCUMENTS

| | | |
|---|---|---|
| 9,368,496 B1 | 6/2016 | Yu et al. |
| 9,412,616 B1 | 8/2016 | Xie et al. |
| 9,425,252 B1 | 8/2016 | Zang et al. |
| 9,589,845 B1 | 3/2017 | Jagannathan et al. |
| 10,062,785 B2 | 8/2018 | Basker et al. |
| 10,784,342 B1 * | 9/2020 | Hong ............... H01L 29/0653 |
| 2016/0013313 A1 | 1/2016 | Cheng et al. |
| 2017/0287933 A1 | 10/2017 | Chen et al. |
| 2018/0323193 A1 | 11/2018 | Greene et al. |
| 2019/0172753 A1 * | 6/2019 | Lin ................... H01L 27/0886 |
| 2020/0051976 A1 | 2/2020 | Ha et al. |
| 2020/0051977 A1 | 2/2020 | Lim et al. |
| 2020/0211859 A1 | 7/2020 | Qing et al. |

* cited by examiner

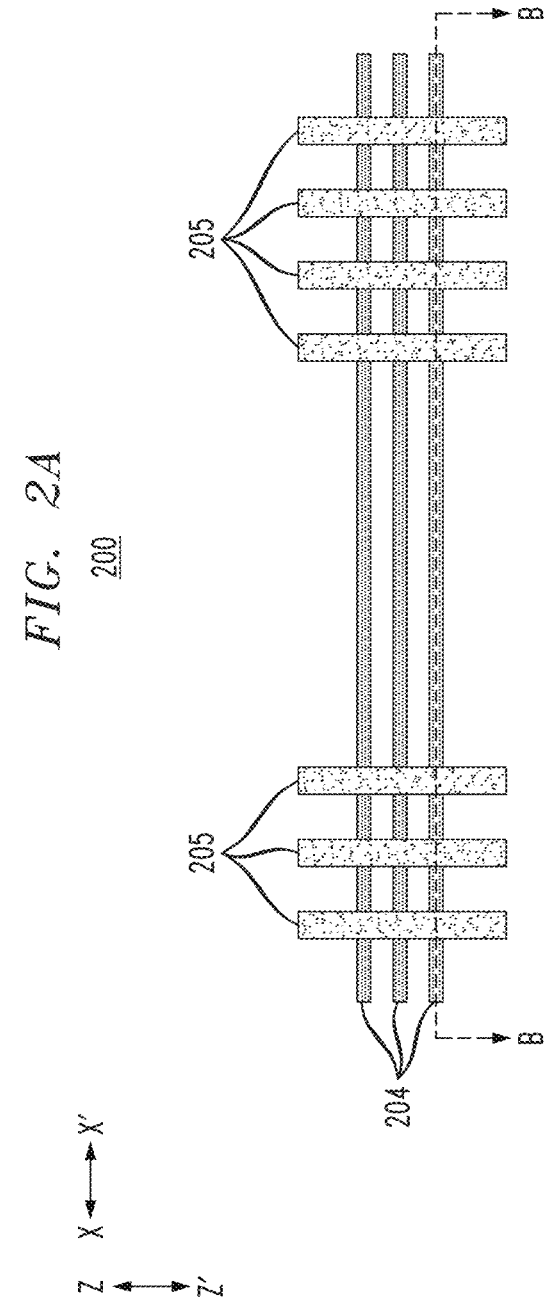

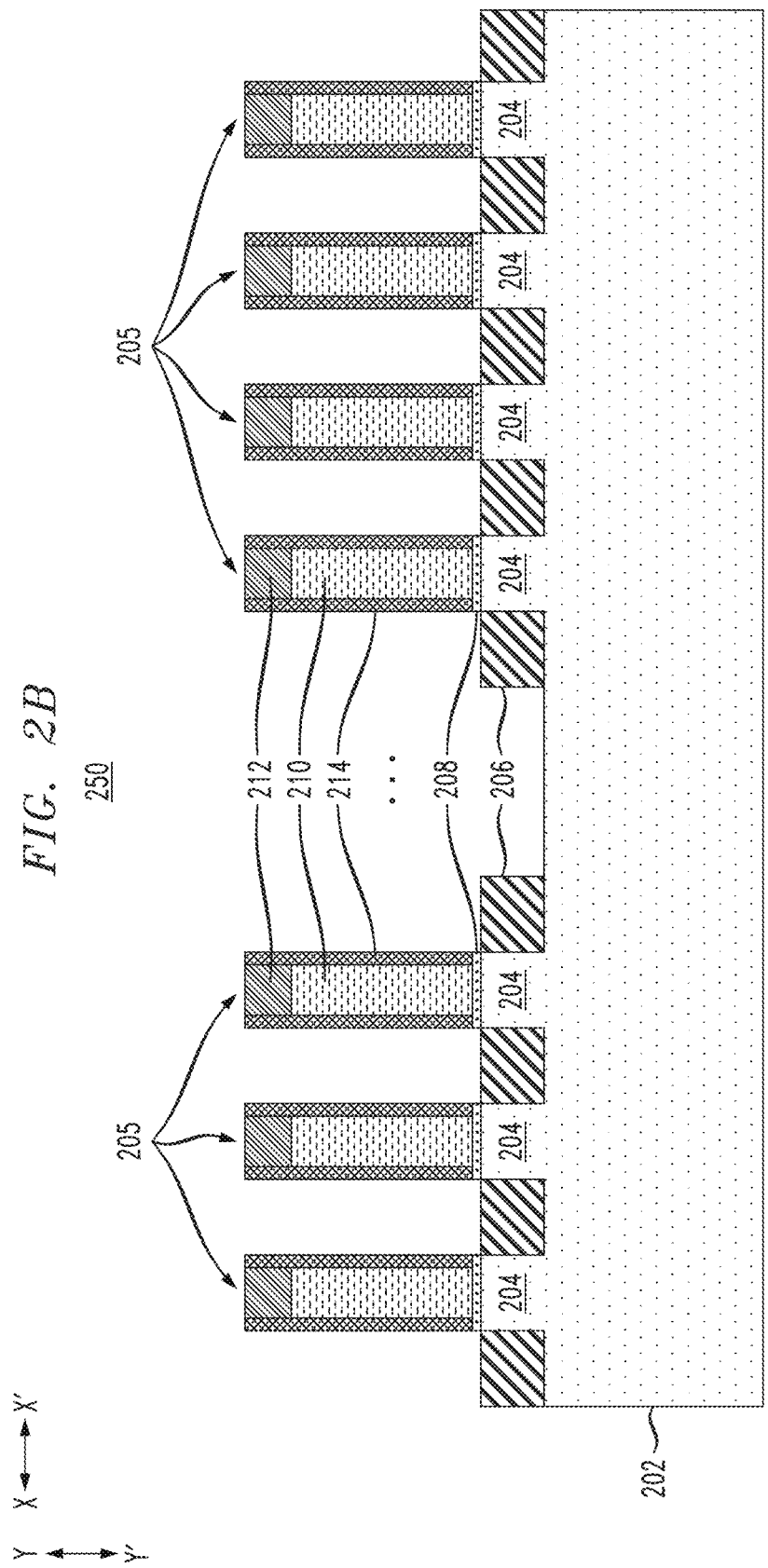

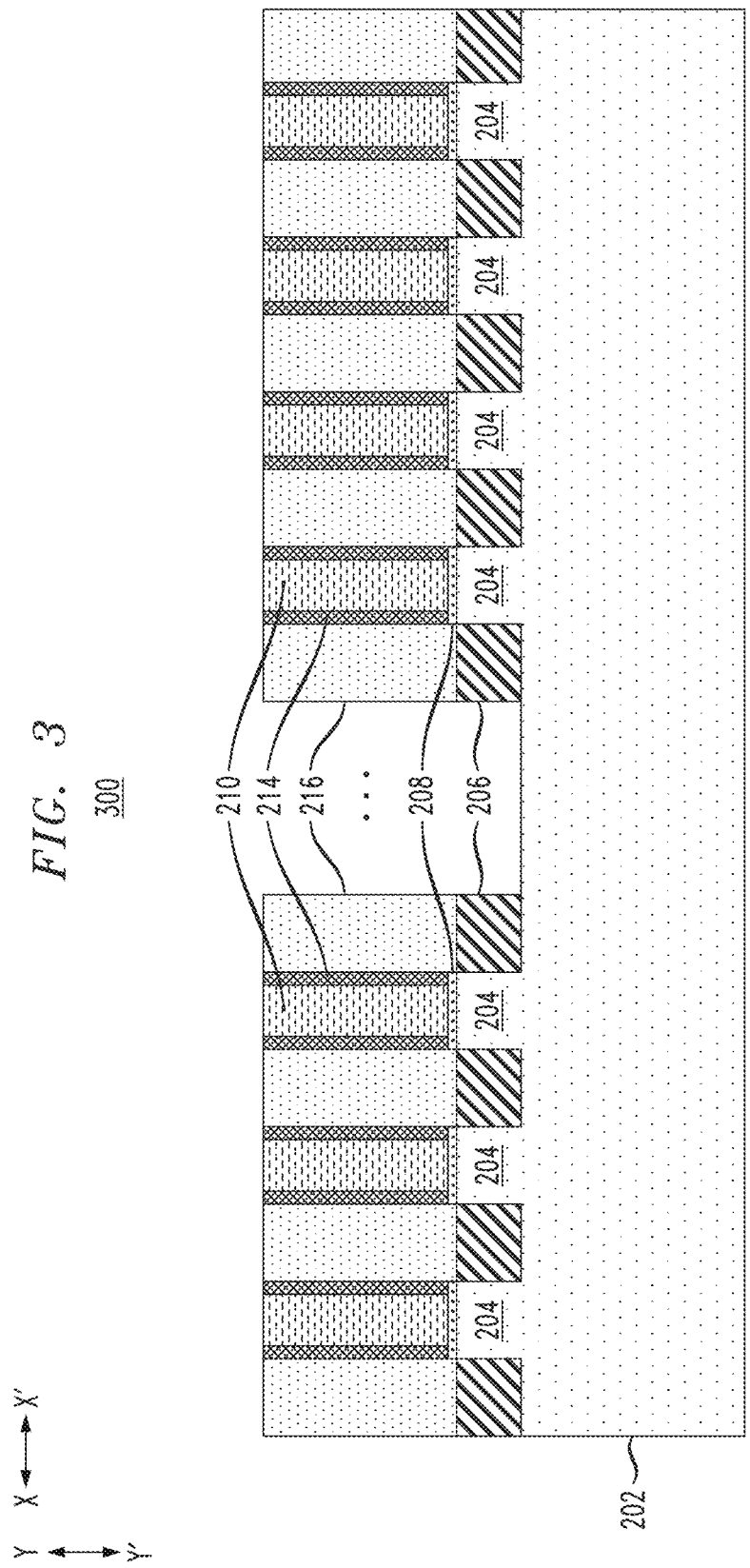

400

1000

1400

US 11,695,038 B2

FORMING SINGLE AND DOUBLE DIFFUSION BREAKS FOR FIN FIELD-EFFECT TRANSISTOR STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming single and double diffusion breaks for fin field-effect transistor structures.

In one embodiment, a method of forming a semiconductor structure comprises forming a plurality of fins over a substrate, at least a portion of one or more of the plurality of fins providing one or more channels for one or more fin field-effect transistors. The method also comprises forming a plurality of active gate structures over portions of the plurality of fins, forming at least one single diffusion break trench between a first one of the plurality of active gate structures and a second one of the plurality of active gate structures, and forming at least one double diffusion break trench between a third one of the plurality of active gate structures and a fourth one of the plurality of active gate structures. The double diffusion break trench has a stepped height profile in the substrate, the stepped height profile comprising a first depth with a first width and a second depth with a second width, the second depth being less than the first depth, the second width being greater than the first width.

In another embodiment, a semiconductor structure comprises a substrate and a plurality of fins disposed over the substrate, at least a portion of one or more of the plurality of fins providing one or more channels for one or more fin field-effect transistors. The semiconductor structure also comprises a plurality of active gate structures disposed over portions of the plurality of fins, at least one single diffusion break trench between a first one of the plurality of active gate structures and a second one of the plurality of active gate structures, and at least one double diffusion break trench between a third one of the plurality of active gate structures and a fourth one of the plurality of active gate structures. The double diffusion break trench has a stepped height profile in the substrate, the stepped height profile comprising a first depth with a first width and a second depth with a second width, the second depth being less than the first depth, the second width being greater than the first width.

In another embodiment, an integrated circuit comprises a fin field-effect transistor structure comprising a substrate and a plurality of fins disposed over the substrate, at least a portion of one or more of the plurality of fins providing one or more channels for one or more fin field-effect transistors. The fin field-effect transistor structure also comprises a plurality of active gate structures disposed over portions of the plurality of fins, at least one single diffusion break trench between a first one of the plurality of active gate structures and a second one of the plurality of active gate structures, and at least one double diffusion break trench between a third one of the plurality of active gate structures and a fourth one of the plurality of active gate structures. The double diffusion break trench has a stepped height profile in the substrate, the stepped height profile comprising a first depth with a first width and a second depth with a second width, the second depth being less than the first depth, the second width being greater than the first width.

BRIEF DESCRIPTION OF THE DRAWINGS

FIG. 2A depicts a top-down view of a semiconductor structure following patterning a set of fins, source/drain regions and sacrificial gate structures, according to an embodiment of the invention.

FIG. 2B depicts a side cross-sectional view of the FIG. 2A structure taken along one of the set of fins, according to an embodiment of the invention.

FIG. 3 depicts a side cross-sectional view of the structure FIG. 2B structure following formation of an interlayer dielectric layer and planarization, according to an embodiment of the invention.

DETAILED DESCRIPTION

Illustrative embodiments of the invention may be described herein in the context of illustrative methods for forming single and double diffusion breaks for fin field-effect transistor structures, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

A field-effect transistor (FET) is a transistor having a source, a gate, and a drain, and having action that depends on the flow of carriers (electrons or holes) along a channel that runs between the source and drain. Current through the channel between the source and drain may be controlled by a transverse electric field under the gate.

FETs are widely used for switching, amplification, filtering, and other tasks. FETs include metal-oxide-semiconductor (MOS) FETs (MOSFETs). Complementary MOS (CMOS) devices are widely used, where both n-type and p-type transistors (nFET and pFET) are used to fabricate logic and other circuitry. Source and drain regions of a FET are typically formed by adding dopants to target regions of a semiconductor body on either side of a channel, with the gate being formed above the channel. The gate includes a gate dielectric over the channel and a gate conductor over the gate dielectric. The gate dielectric is an insulator material that prevents large leakage current from flowing into the channel when voltage is applied to the gate conductor while allowing applied gate voltage to produce a transverse electric field in the channel.

Increasing demand for high density and performance in integrated circuit devices requires development of new structural and design features, including shrinking gate lengths and other reductions in size or scaling of devices. Continued scaling, however, is reaching limits of conventional fabrication techniques.

Three-dimensional chip fabrication techniques may be used to form fin field-effect transistors (FinFETs). A FinFET is a non-planar FET. The "fin" of the FinFET is a narrow, vertical channel between the source and the drain. The fin is covered by a gate dielectric and bordered on two or three sides by an overlaying gate conductor. The multiple surfaces of the gate allow for more effective suppression of "off-state" leakage current. The multiple surfaces of the gate also allow enhanced current in the "on" state, also known as drive current. These advantages translate to lower power consumption and enhanced device performance.

Figure 1:
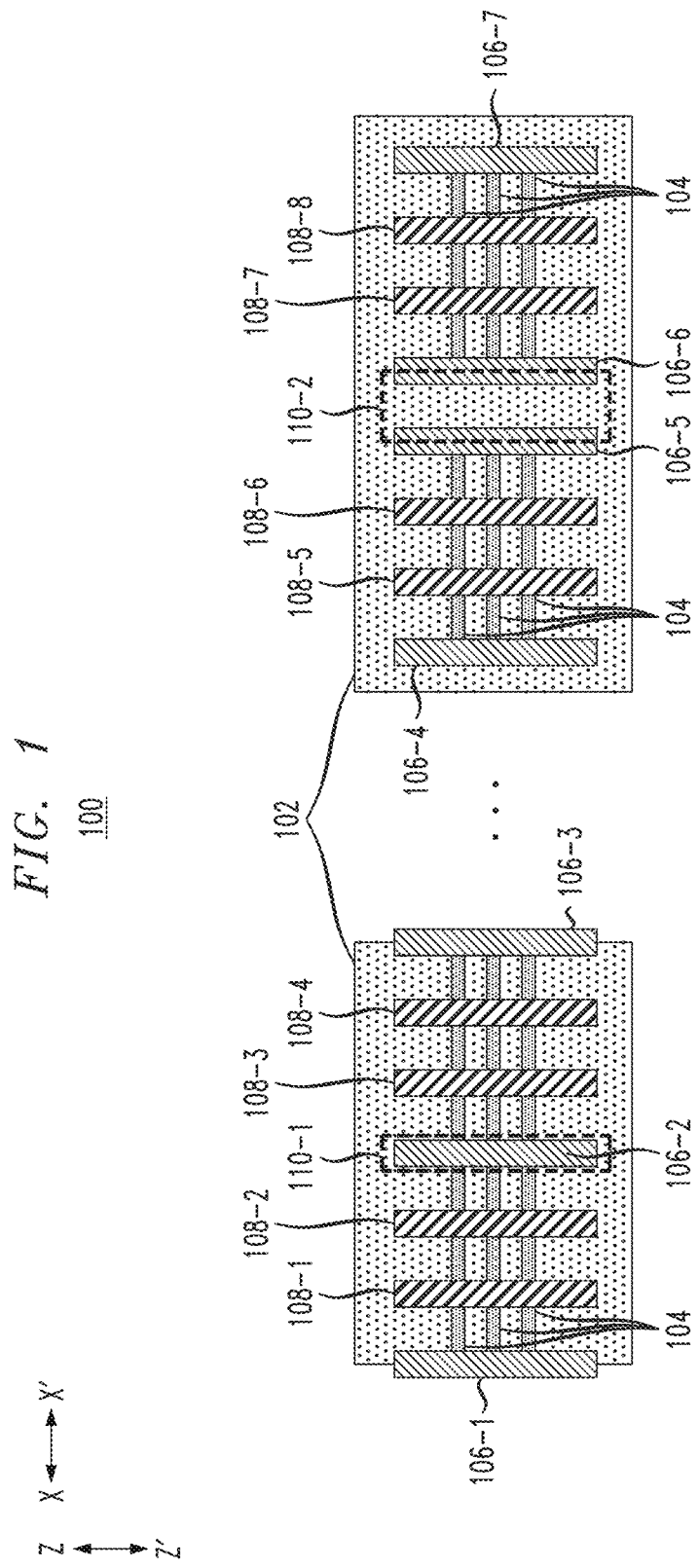
FIG. 1 depicts a top-down view of a semiconductor structure with both single and double diffusion breaks between sets of active gates formed over a set of fins, according to an embodiment of the invention.

For some FinFET structures, it is desired to form mixed single diffusion break (SDB) and double diffusion break (DDB) structures. FIG. 1 depicts a top-down view 100 of a structure including a substrate 102, a plurality of fins 104 formed over the substrate 102, a set of dummy gates 106-1, 106-2, 106-3, 106-4, 106-5, 106-6 and 106-7 (collectively, dummy gates 106) and a set of active gates 108-1, 108-2, 108-3, 108-4, 108-5, 108-6, 108-7 and 108-8 (collectively, active gates 108). As illustrated, a SDB region 110-1 is provided by the dummy gate 106-2 between active gates 108-2 and 108-3. A DDB region 110-2 is provided by the dummy gates 106-5 and 106-6 between active gates 108-6 and 108-7.

The fins 104, which may provide channels for FinFETs, may initially be formed across the entire substrate 102. Later, portions of the fins 104 may be removed to electrically isolate different sets of the active gates 108. For example, the fins are removed in the SDB region 110-1 and the DDB region 110-2 using fin cut processes. A fin cut process may utilize a fin cut mask with openings where portions of the fins 104 are to be removed to provide a desired isolation between different sets of the active gates 108. An insulating material may be formed in the spaces where the fins 104 are removed (e.g., in the SDB region 110-1 and the DDB region 110-2). In some cases, gate-last or replacement metal gate (RMG) processes are utilized to form the active gates 108. For gate-last and RMG processes, the active gates 108 may be formed after the fin cut process by removing and replacing sacrificial or dummy gate structures initially formed over the fins 104.

The SDB 110-1, as illustrated in FIG. 1, has a "width" (in direction X-X') between the active gates 108-2 and 108-3 that is about or less than the lateral width of one of the gate structures 106/108. The DDB 110-2, as illustrated in FIG. 1, has a "width" (in direction X-X') between the active gates 108-6 and 108-7 that is about or greater than the lateral width of two of the gate structures 106/108. DDB regions may be easier to form than SDB regions, but DDB regions consume more area than SDB regions. As noted above, in some structures it is desired to use both SDB and DDB. For example, an integrated circuit may have different regions of active gates used to provide different functionality (e.g., regions of active gates for logic, regions of active gates for memory, etc.). It may be desired to use SDB isolation for regions of active gates that provide a first type of functionality (e.g., logic devices) and to use DDB isolation for regions that provide a second type of functionality (e.g., memory devices).

There are a number of challenges in forming mixed SDB and DDB structures. For example, current carrying capability, and thus performance of a FET, may be considered proportional to the mobility of a majority carrier in the channel. The mobility of holes (e.g., the majority carriers in a pFET) and the mobility of electrons (e.g., the majority carriers in an nFET) can be enhanced by applying an appropriate stress to the channel. Stress engineering methods may be used to enhance performance, increasing device drive current without increasing device size or capacitance. Application of a tensile stress to nFETs enhances electron mobility, while application of compressive stress to pFETs enhances hole mobility. When a fin cut is performed prior to formation of gate structures for FinFETs, the resulting FinFETs may lose a desired stress (e.g., compressive or tensile stress) due to stress relaxation at the fin cut ends resulting in variations in device performance.

A fin cut can be performed after dummy gate and source/drain formation, where DDBs can be formed in the open area defined by a fin cut mask. Using such techniques, however, there may be fins or portions of fins that need to be removed to form SDBs that are covered by the dummy gates.

A fin cut can also be performed after dummy gate material is removed. SDBs, for example, can be formed in an open area defined by a fin cut mask since fins which are covered by the dummy gate are exposed. Such techniques, however, face various challenges in ensuring that the fin cut opening is properly aligned to the replacement cavity. Further, fins that need to be removed to form DDBs are usually covered by an insulating material (e.g., an interlayer dielectric (ILD) layer formed over a source/drain epitaxial layer or region).

The above-described techniques also have the drawback of increased cost as multiple masks may be needed since it is difficult or not possible to combine different fin cuts in a single mask. Conventional techniques, for example, may form DDBs during the fin patterning process while forming SDBs in a poly open chemical mechanical planarization (CMP) (POC) step during the gate formation process, and thus the fin cut must be decomposed into two separated fin cut masks.

Illustrative embodiments provide techniques for forming SDB and DDB using a single lithography mask and a late cut process. The fin cut may be performed after formation of the dummy gate and source/drain epitaxial layers or regions, to retain any intrinsic stress in the fins providing channels for resulting FinFET devices. Both the SDB and DDB are formed by using one fin cut mask in some embodiments thereby reducing process complexity and cost. In addition, both SDB and DDB trenches may be filled with a dielectric material to reduce parasitic capacitance in resulting FinFET devices. Dummy gate regions adjacent the SDBs and DDBs may also be filled with a dielectric material to further reduce the parasitic capacitance.

In some embodiments, a semiconductor structure is formed comprising a plurality of replacement gate structures on top of a plurality of fins on a semiconductor substrate. The plurality of fins may provide channels for a plurality of FinFET devices. The semiconductor structure includes at least one SDB dielectric isolation formed in a first trench in a first active region and at least one DDB dielectric isolation formed in a second trench in a second active region. A top portion of dielectric material filled in the SDB region may have a partial bi-layer dielectric spacer on both sides, and the dielectric material filled in the DDB region may have a bi-layer dielectric spacer on both sides.

Illustrative embodiments for forming both single and double diffusion breaks for FinFET structures will now be described with respect to FIGS. 2-15.

FIG. 2A shows a top-down view 200 of a set of fins 204 and a set of sacrificial gates 205 formed over the set of fins 204. FIG. 2B shows a side cross-sectional view 250 that is taken along line B-B shown in the top-down view 200 of FIG. 2A, e.g., the side cross-sectional view 250 is taken along one of the fins 204. FIGS. 3-15 similarly show side cross-sectional views that are taken along one of the fins 204.

The structure shown in FIG. 2B may be formed as described below. The fins 204 are formed over the substrate 202, such as by patterning the fins 204 from material of the substrate 202. This may involve patterning a hard mask over a top surface of the substrate 202, followed by etching (e.g., using reactive-ion etching (RIE)) to remove exposed portions of the substrate 202 exposed by the patterned hard mask to result in the fins 204. The fins 204 may also be formed using techniques such as sidewall image transfer (SIT), self-aligned double patterning (SADP), self-aligned multiple patterning (SAMP), self-aligned quadruple patterning (SAQP), etc.

Each of the fins 204 may have a width (in direction Z-Z') in the range of 4 nanometers (nm) to 12 nm, and a height or vertical thickness (in direction Y-Y') in the range of 20 to 60 nm.

The substrate 202 may comprise bulk silicon (Si), or another suitable substrate material, e.g., a bulk semiconductor, a semiconductor-on-insulator (SOI) substrate, etc. In some embodiments, the substrate 202 includes a silicon-containing material. Illustrative examples of Si-containing materials suitable for the substrate 202 can include, but are not limited to, Si, silicon germanium (SiGe), carbon doped silicon germanium (SiGe:C), silicon germanium carbide (SiGeC), carbon-doped silicon (Si:C), silicon carbide (SiC) and multi-layers thereof. Although silicon is the predominantly used semiconductor material in wafer fabrication, alternative semiconductor materials can be employed as additional layers, such as, but not limited to, germanium (Ge), gallium arsenide (GaAs), gallium nitride (GaN), SiGe, cadmium telluride (CdTe), zinc selenide (ZnSe), germanium tin (GeSn), etc. In some embodiments, epitaxy growth can be performed to form the substrate 202 with different materials. For example, SiGe epitaxy can be performed to grow SiGe on a silicon wafer.

The sacrificial gates 205 are then patterned. The sacrificial gates 205 may be formed by depositing a dummy oxide and a dummy gate, followed by patterning a gate hard mask layer 212 in the regions where the sacrificial gates 205 are to be formed and removing exposed portions of the dummy oxide and dummy gate resulting in the dummy oxide layer 208 and dummy gate layer 210 shown in FIG. 2B. The dummy oxide layer 208 may be formed of silicon dioxide ($SiO_2$) or another suitable material. The dummy oxide layer 208 may have a height or vertical thickness (in direction Y-Y') in the range of 1 to 5 nm. The dummy gate layer 210 may be formed of amorphous silicon (a-Si) or another suitable material such as polycrystalline silicon (polysilicon). The dummy gate layer 210 may have a height or vertical thickness (in direction Y-Y') in the range of 12 to 60 nm. The gate hard mask layer 212 may have a height or vertical thickness (in direction Y-Y') in the range of 20 to 60 nm. The dummy oxide layer 208, dummy gate layer 210 and gate hard mask layer 212 of each of the sacrificial gates 205 may have a width (in direction X-X') in the range of 10 to 60 nm.

Gate sidewall spacers 214 are formed surrounding the dummy oxide layer 208, dummy gate layer 210 and gate hard mask layer 212 as illustrated in FIG. 2A. The gate sidewall spacers 214 may be formed of silicon nitride (SiN), silicon carbide (SiC), silicon oxynitride (SiON), carbon-doped silicon oxide (SiOC), silicon-carbon-nitride (SiCN), boron nitride (BN), silicon boron nitride (SiBN), silicoboron carbonitride (SiBCN), silicon oxycarbonitride (SiOCN), another suitable material, or any suitable combination of such materials. The gate sidewall spacers 214 may have a thickness (in direction X-X') in the range of 3 nm to 10 nm.

After formation of the sacrificial gates 205, source/drain epitaxial layers 206, also referred to herein as source/drain regions 206, are formed. The source/drain regions 206 may have a height or vertical thickness (in direction Y-Y') in the range of 20 to 50 nm. The source/drain regions 206 may be formed, for example, by implantation of a suitable dopant, such as using ion implantation, gas phase doping, plasma doping, plasma immersion ion implantation, cluster doping, infusion doping, liquid phase doping, solid phase doping, etc. N-type dopants may be selected from a group of phosphorus (P), arsenic (As) and antimony (Sb), and p-type dopants may be selected from a group of boron (B), boron fluoride ($BF_2$), gallium (Ga), indium (In), and thallium (Tl).

The source/drain regions 206 may also be formed by an epitaxial growth process. In some embodiments, the epitaxy process comprises in-situ doping (dopants are incorporated in epitaxy material during epitaxy). Epitaxial materials may be grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RTCVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. Epitaxial silicon, silicon germanium (SiGe), germanium (Ge), and/or carbon doped silicon (Si:C) silicon can be doped during deposition (in-situ doped) by adding dopants, such as n-type dopants (e.g., phosphorus or arsenic) or p-type dopants (e.g., boron or gallium), depending on the type of transistor. The dopant concentration can range from $1 \times 10^{19}$ cm$^{-3}$ to $3 \times 10^{21}$ cm$^{-3}$, or preferably between $2 \times 10^{20}$ cm$^{-3}$ to $3 \times 10^{21}$ cm$^{-3}$.

FIG. 3 shows a side cross-sectional view 300 of the FIG. 2B structure following formation and planarization of an ILD layer 216. The ILD layer 216 may be formed by depositing an ILD material such as SiO$_2$, high temperature oxide, low temperature oxide, flowable oxide, a low-k dielectric material, or another suitable isolation material. A low-k dielectric material can include, but not be limited to, carbon doped silicon oxide (SiO:C), fluorine doped silicon oxide (SiO:F), polymeric material, for example, tetraethyl orthosilicate (TEOS), hydrogen silsesquioxane (HSQ), methylsilsesquioxane (MSQ), SiON, SiCN, BN, SiBN, SiBCN, silicon SiOCN, and combinations thereof. The ILD material may then be planarized, such as using CMP stopping on a top surface of the dummy gate layer 210, thus removing the gate hard mask layer 212.

Figure 4:
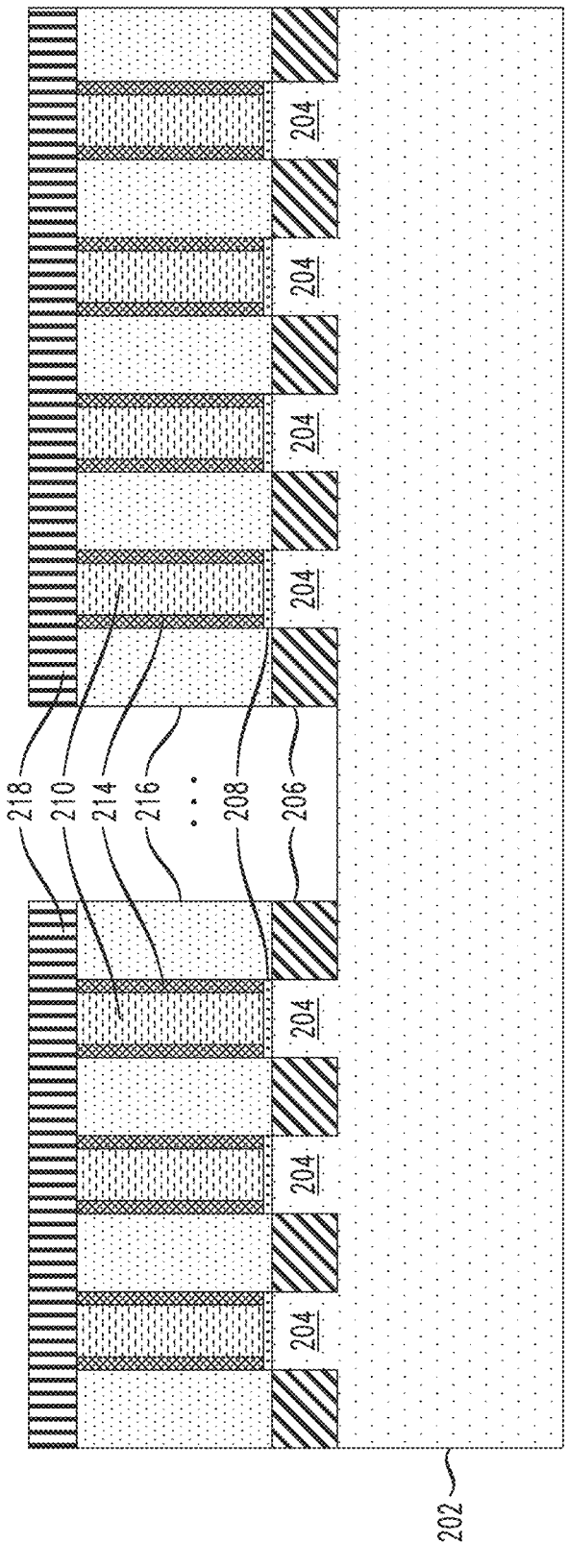
FIG. 4 depicts a side cross-sectional view of the FIG. 3 structure following formation of a sacrificial mask layer, according to an embodiment of the invention.

FIG. 4 shows a side cross-sectional view 400 of the FIG. 3 structure following formation of a sacrificial mask layer 218. The sacrificial mask layer 218 may be formed of silicon carbide (SiC) or another suitable material such as aluminum oxide (Al$_2$O$_3$), SiN, SiON, SiCN, SiBN, silicon borocarbide (SiBC), SiBCN, or combinations thereof. In various embodiments, the sacrificial mask layer 218 can be a different hard mask material than that used for the dummy gate layer 210, the gate sidewall spacers 214 and the ILD layer 216 described in further detail below, such that the sacrificial mask layer 218 can protect the unexposed regions during downstream processing. The sacrificial mask layer 218 may be formed using a blanket deposition process such as atomic layer deposition (ALD), chemical vapor deposition (CVD), plasma-enhanced chemical vapor deposition (PECVD), high density plasma (HDP) deposition, physical vapor deposition (PVD), etc. The sacrificial mask layer 218 may have a height or vertical thickness (in direction Y-Y') in the range of 20 to 50 nm.

Figure 5:
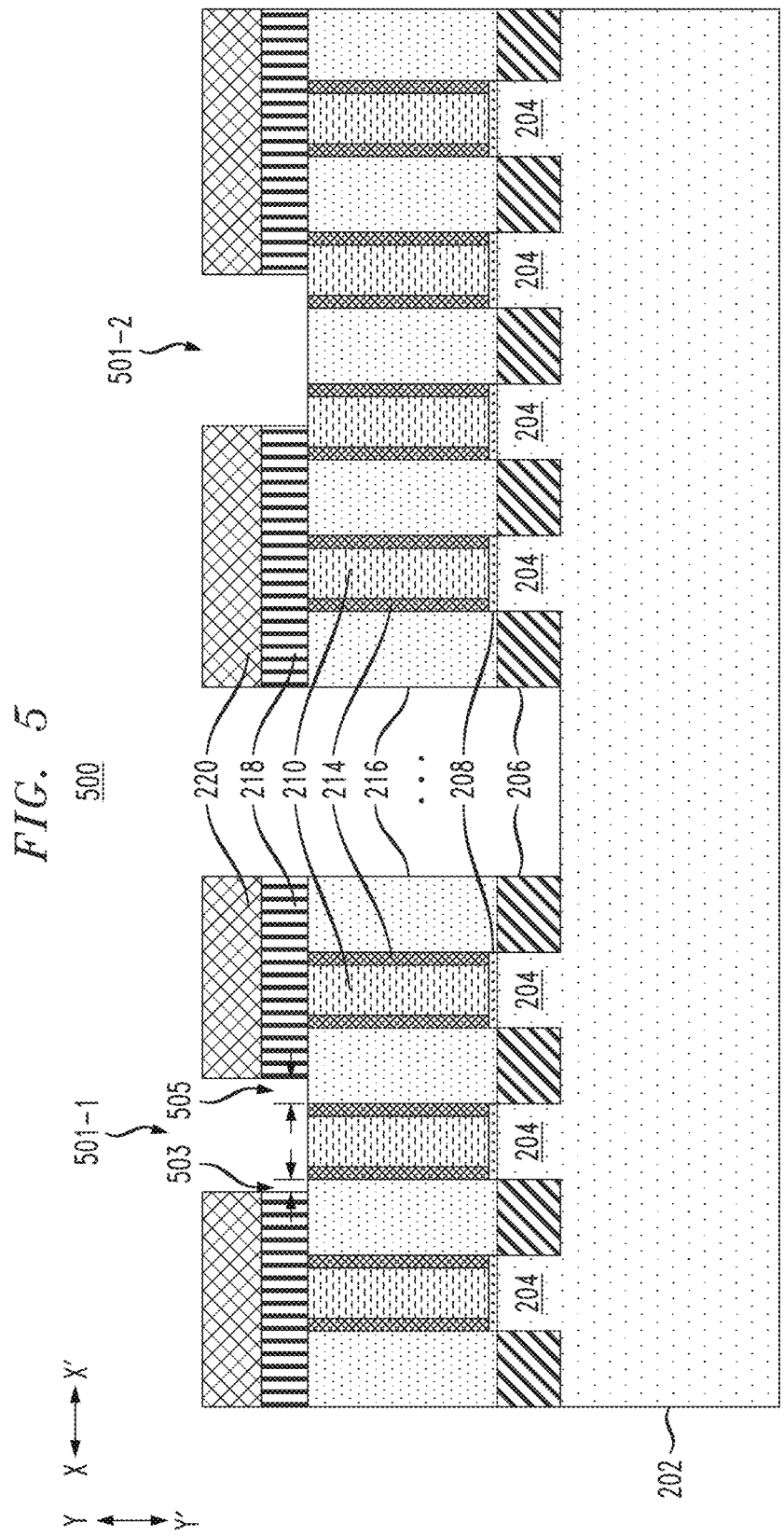
FIG. 5 depicts a side cross-sectional view of the FIG. 4 structure following formation of an additional mask layer and patterning to form single diffusion break and double diffusion break openings, according to an embodiment of the invention.

FIG. 5 shows a side cross-sectional view 500 of the FIG. 4 structure following formation and patterning of an additional mask layer 220. The additional mask layer 220 may be formed of photoresist and patterned to form openings 501-1 and 501-2 (collectively, openings 501) in a single lithography and etching step that removes portions of the underlying sacrificial mask layer 218 below the patterned mask layer 220. The opening 501-1 provides an opening for a SDB region while the opening 501-2 provides an opening for a DDB region. As illustrated in FIG. 5, the SDB opening 501-1 is not necessarily perfectly aligned, in that distance 503 is less than distance 505. Similarly, the DDB opening 501-2 need not be perfectly aligned.

Figure 6:
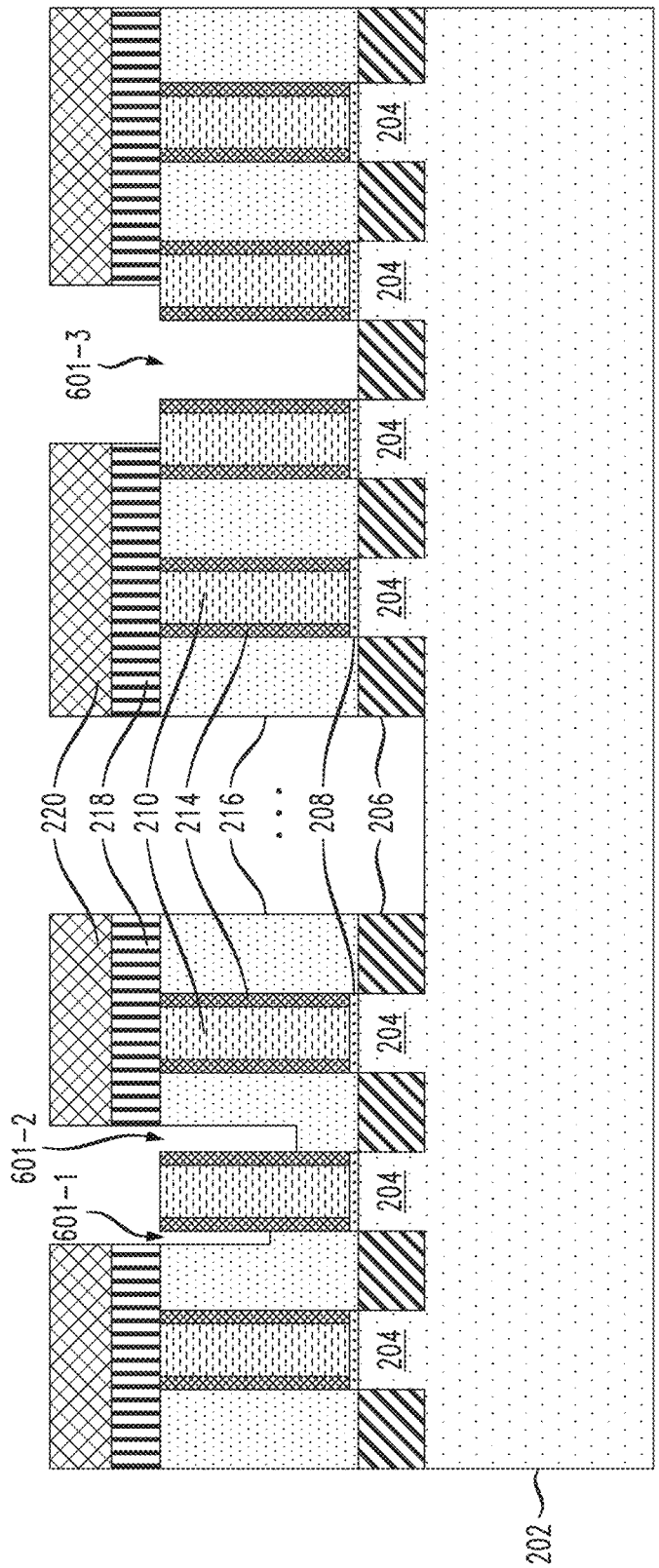
FIG. 6 depicts a side cross-sectional view of the FIG. 5 structure following a directional etch of the interlayer dielectric layer, according to an embodiment of the invention.

FIG. 6 shows a side cross-sectional view 600 of the FIG. 5 structure following a directional etch (e.g., using directional RIE) to remove portions of the ILD material of ILD layer 216. The directional etch stops on the source/drain region 206 exposed by the DDB opening 501-2, resulting in trench 601-3. As illustrated in FIG. 6, a certain amount of the ILD material of ILD layer 216 in the SDB opening 501-1 will also be etched away. Due to the narrower opening, however, the depth of the etching will be limited. Thus, as illustrated in FIG. 6, the depth of the etching is less on the "left" side 601-1 corresponding to distance 503 than on the "right" side 601-2 corresponding to distance 505. The depth of the etching of the ILD material of ILD layer 216 in the SDB opening 501-1 may be in the range of 10 to 50 nm, depending on how narrow the distances 503 and 505 are.

Figure 7:
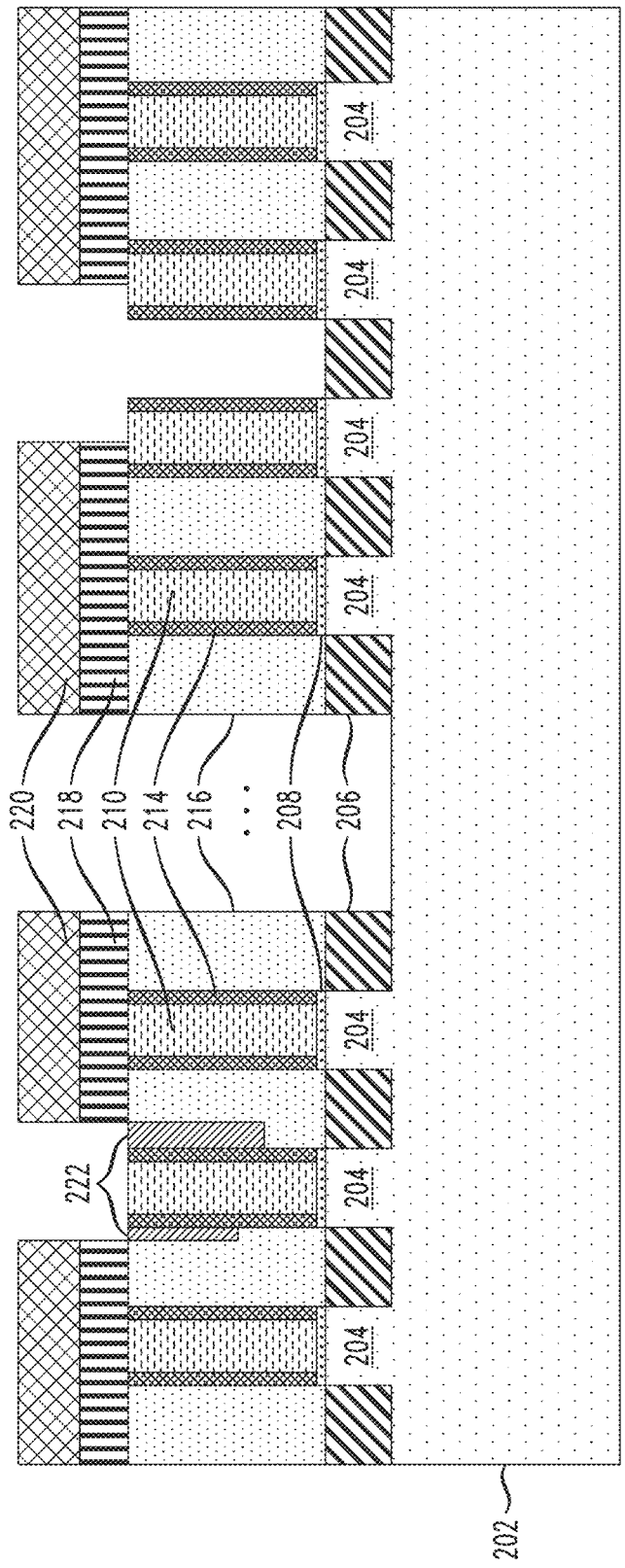
FIG. 7 depicts a side cross-sectional view of the FIG. 6 structure following formation of a dielectric liner in the single diffusion break opening, according to an embodiment of the invention.

FIG. 7 shows a side cross-sectional view 700 of the FIG. 6 structure following formation of a dielectric liner 222 in the SDB opening 501-1 to divot fill the space formed by the directional etch of the ILD material of ILD layer 216. The dielectric liner 222 may be formed of SiO$_2$ or another suitable material. The dielectric liner 222 may be formed through deposition and etch back (e.g., divot fill). The dielectric liner 222 will be pinched off inside the small gaps in the SDB opening 501-1, while it can be removed completely in the comparatively wider DDB opening 501-2. The material of the dielectric liner 222 is initially deposited everywhere, followed by an isotropic etch. Due to the smaller area, the etch rate is slower in the SDB opening 501-1 than in the DDB opening 501-2 such that the dielectric liner 222 is completely removed from the DDB opening 501-2 and remains only in the narrow regions formed during the directional etch of the ILD material of ILD layer 216 in the SDB opening 501-1.

Figure 8:
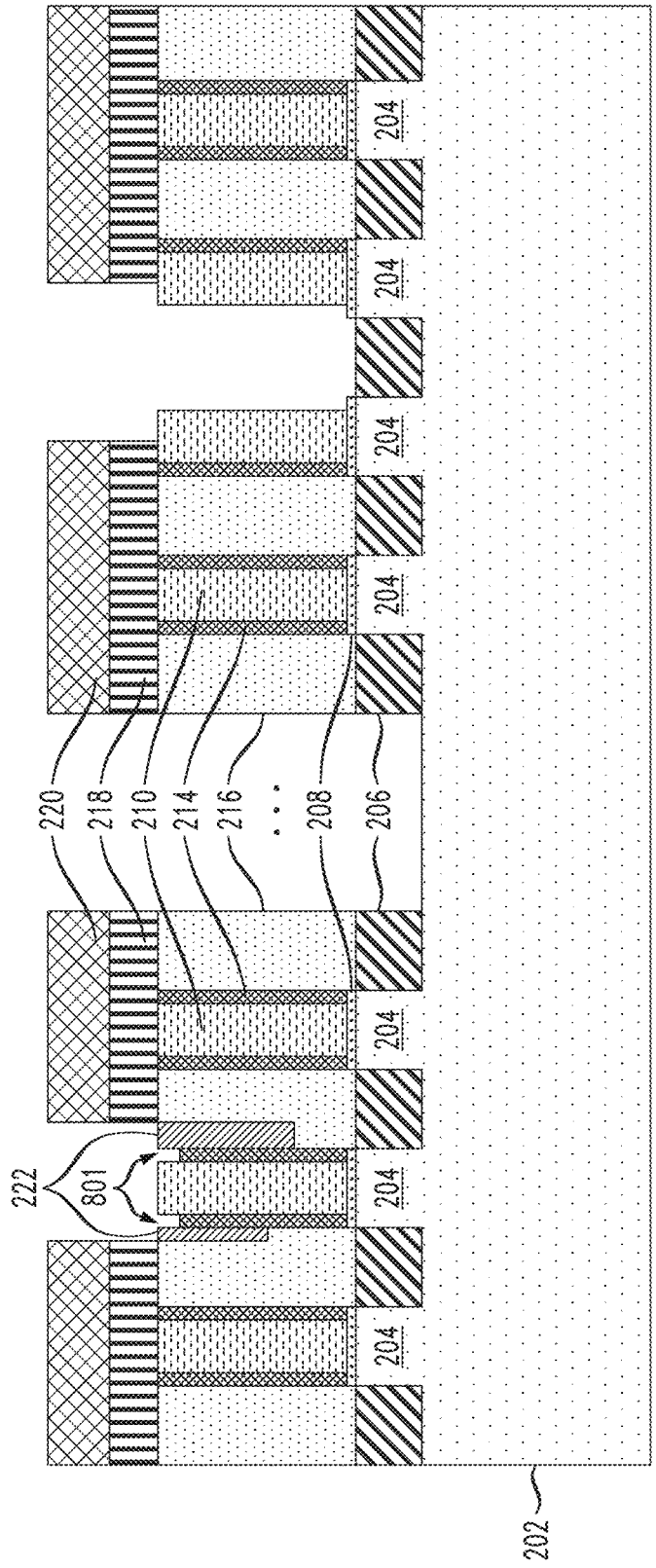
FIG. 8 depicts a side cross-sectional view of the FIG. 7 structure following an isotropic etch of the spacers, according to an embodiment of the invention.

FIG. 8 shows a side cross sectional-view 800 of the FIG. 7 structure following an isotropic etch of the gate sidewall spacers 214 exposed by the openings 501-1 and 501-2. Similar to etch-back of the dielectric liner 222, the etch rate is slower in the SDB opening 501-1 such that only portions 801 of the exposed gate sidewall spacers 214 are removed in the SDB opening 501-1 while the exposed gate sidewall spacers 214 in the DDB opening 501-2 are completely removed.

Figure 9:
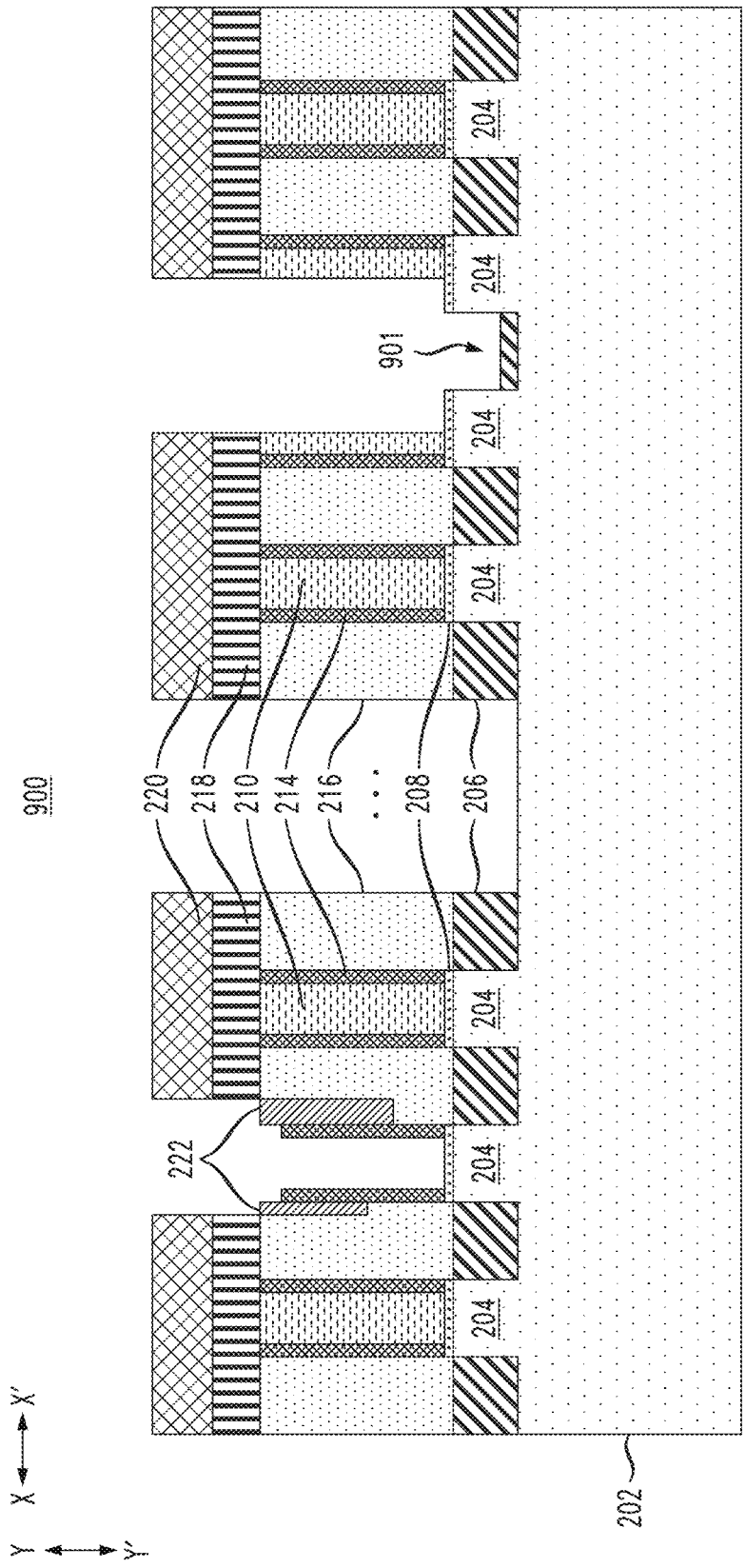
FIG. 9 depicts a side cross-sectional view of the FIG. 8 structure following etching of exposed portions of the dummy gates, according to an embodiment of the invention.

FIG. 9 shows a side cross-sectional view 900 of the FIG. 8 structure following etching of exposed portions of the dummy gate layer 210 in both openings 501-1 and 501-2. The etching stops on the dummy oxide layer 208. In the DDB opening 501-2, at least a portion 901 of the exposed source/drain region 206 is also etched. It is possible that this etching step continues to recess the exposed source/drain region 206 completely as well as a portion of the underlying substrate. Alternately, another etching step is used to remove the remaining portion of the exposed source/drain region 206.

Figure 10:
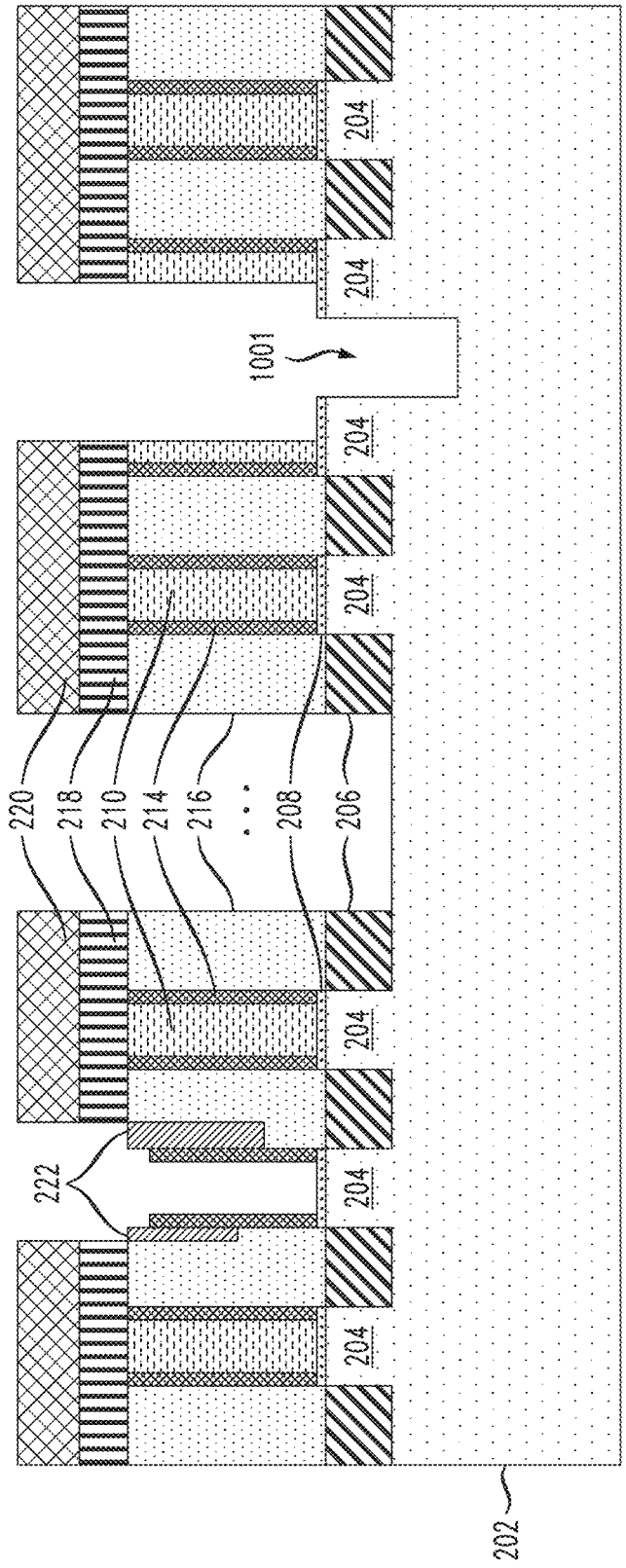
FIG. 10 depicts a side cross-sectional view of the FIG. 9 structure following recess of an exposed source/drain region in the double diffusion break opening into the substrate, according to an embodiment of the invention.

FIG. 10 shows a side cross-sectional view 1000 of the FIG. 9 structure following the additional etching step that removes the remaining portion of the exposed source/drain region 206 and forms a trench 1001 in the substrate 202 in the DDB opening 501-2. As noted above, in some embodiments the processing in FIGS. 9 and 10 may be combined using a single etching.

Figure 11:
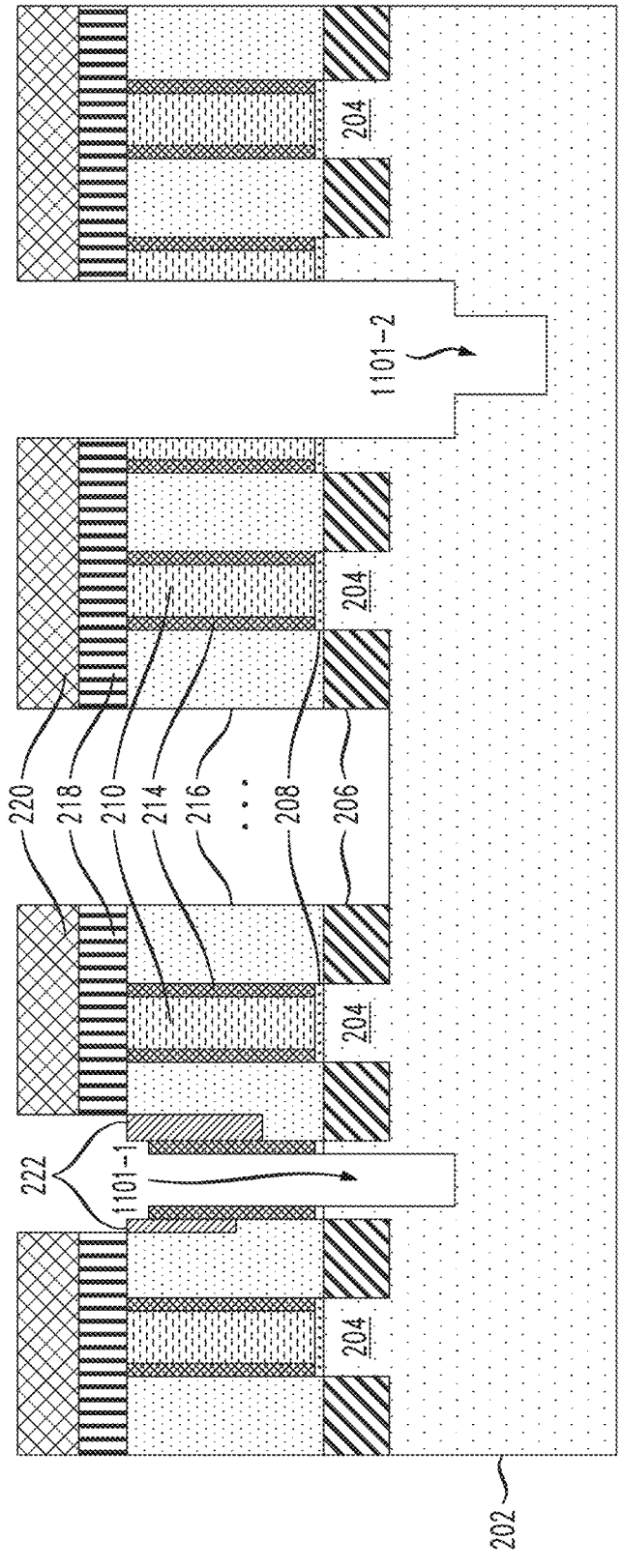
FIG. 11 depicts a side cross-sectional view of the FIG. 10 structure following removal of the exposed dummy oxide in the single diffusion break opening and forming of trenches in the single and double diffusion break openings, according to an embodiment of the invention.

FIG. 11 shows a side cross-sectional view 1100 of the FIG. 10 structure following removal of exposed portions of the dummy oxide layer 208 in both openings 501-1 and 501-2, and following formation of trenches 1101-1 and 1101-2 in the SDB opening 501-1 and DDB opening 501-2, respectively. The SDB trench 1101-1 and DDB trench 1101-2 may be formed using RIE or another suitable etching process. As illustrated in FIG. 11, the DDB trench 1101-2 has a stepped or staircase profile, with an inner portion that is deeper in the substrate relative to an outer portion.

Figure 12:
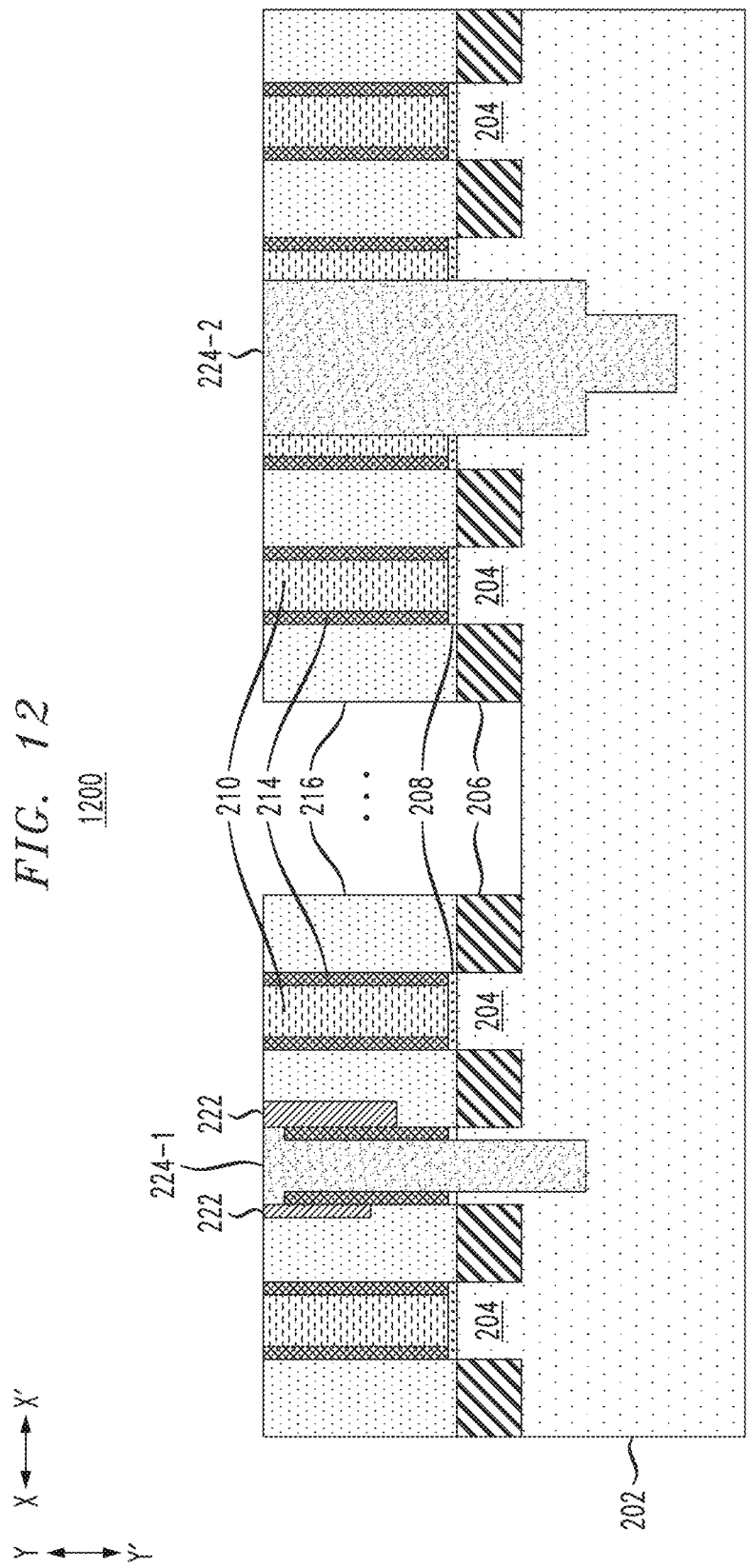
FIG. 12 depicts a side cross-sectional view of the FIG. 11 structure following removal of the sacrificial and additional mask layers and following formation and planarization of an insulating dielectric layer, according to an embodiment of the invention.

FIG. 12 shows a side cross-sectional view 1200 of the FIG. 11 structure following removal of the sacrificial mask layer 218 and additional mask layer 220, and following formation of an insulating dielectric layer 224-1 and 224-2 (collectively, insulating dielectric layer 224) in the SDB trench 1101-1 and the DDB trench 1101-2, respectively. The insulating dielectric layer 224 may be formed of an oxide or another suitable material. The material of the insulating dielectric layer 224 may initially be filled over the structure, followed by planarization (e.g., using CMP) to form the insulating dielectric layer 224.

Figure 13:
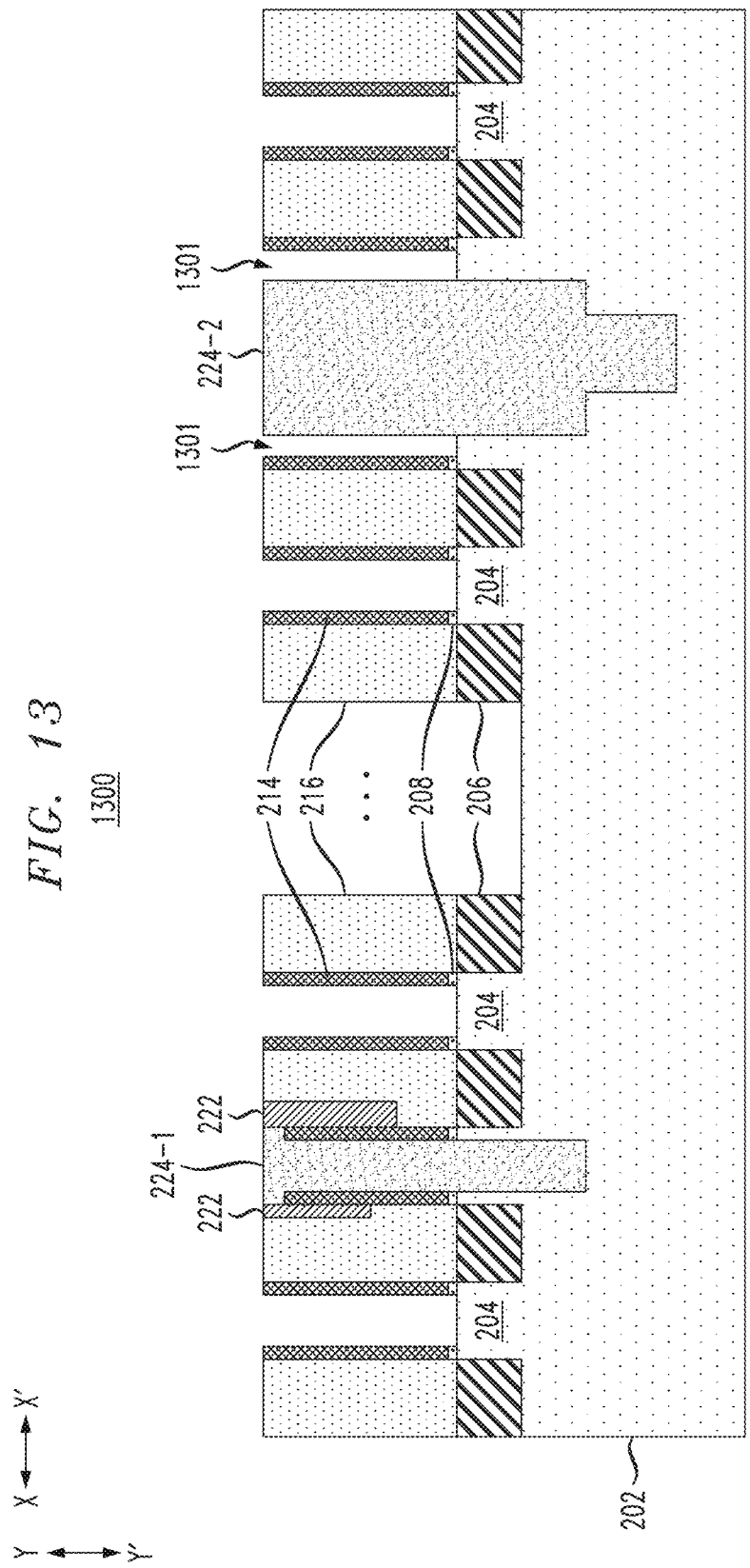
FIG. 13 depicts a side cross-sectional view of the FIG. 12 structure following removal of exposed portions of the dummy gates and underlying dummy oxide layers, according to an embodiment of the invention.

FIG. 13 shows a side cross-sectional view 1300 of the FIG. 12 structure following removal of exposed portions of the dummy gate layer 210 and dummy oxide layer 208. As illustrated in FIG. 13, this results in gaps 1301 adjacent the insulating dielectric layer 224-2 formed in the DDB trench 1101-2.

Figure 14:
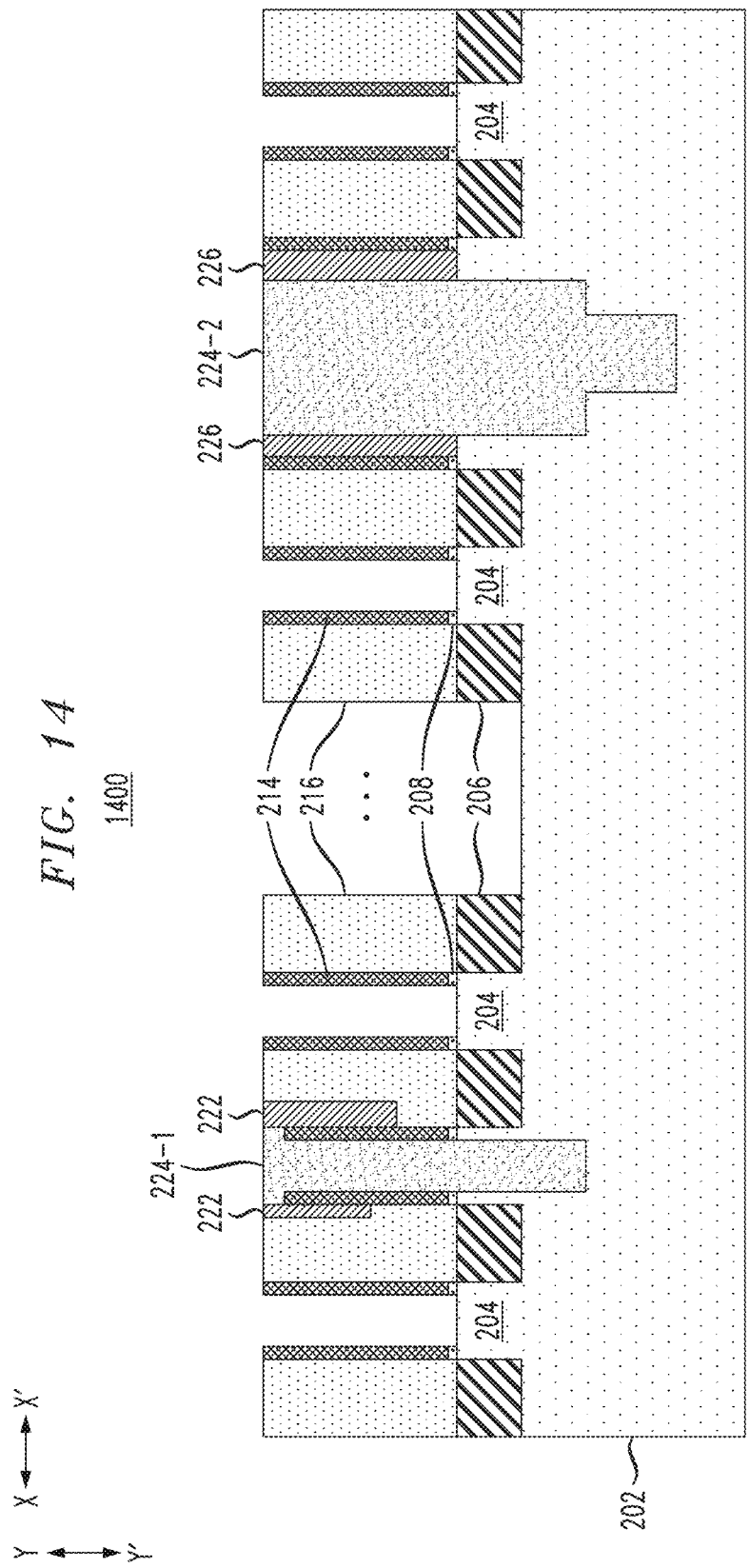
FIG. 14 depicts a side cross-sectional view of the FIG. 13 structure following formation of another dielectric liner in exposed regions adjacent the double diffusion break opening, according to an embodiment of the invention.

FIG. 14 shows a side cross-sectional view 1400 of the FIG. 13 structure following filling of the gaps 1301 with dielectric liner 226. The dielectric liner 226 may be formed of similar materials and with similar processing as that described above with respect to dielectric liner 222.

Figure 15:
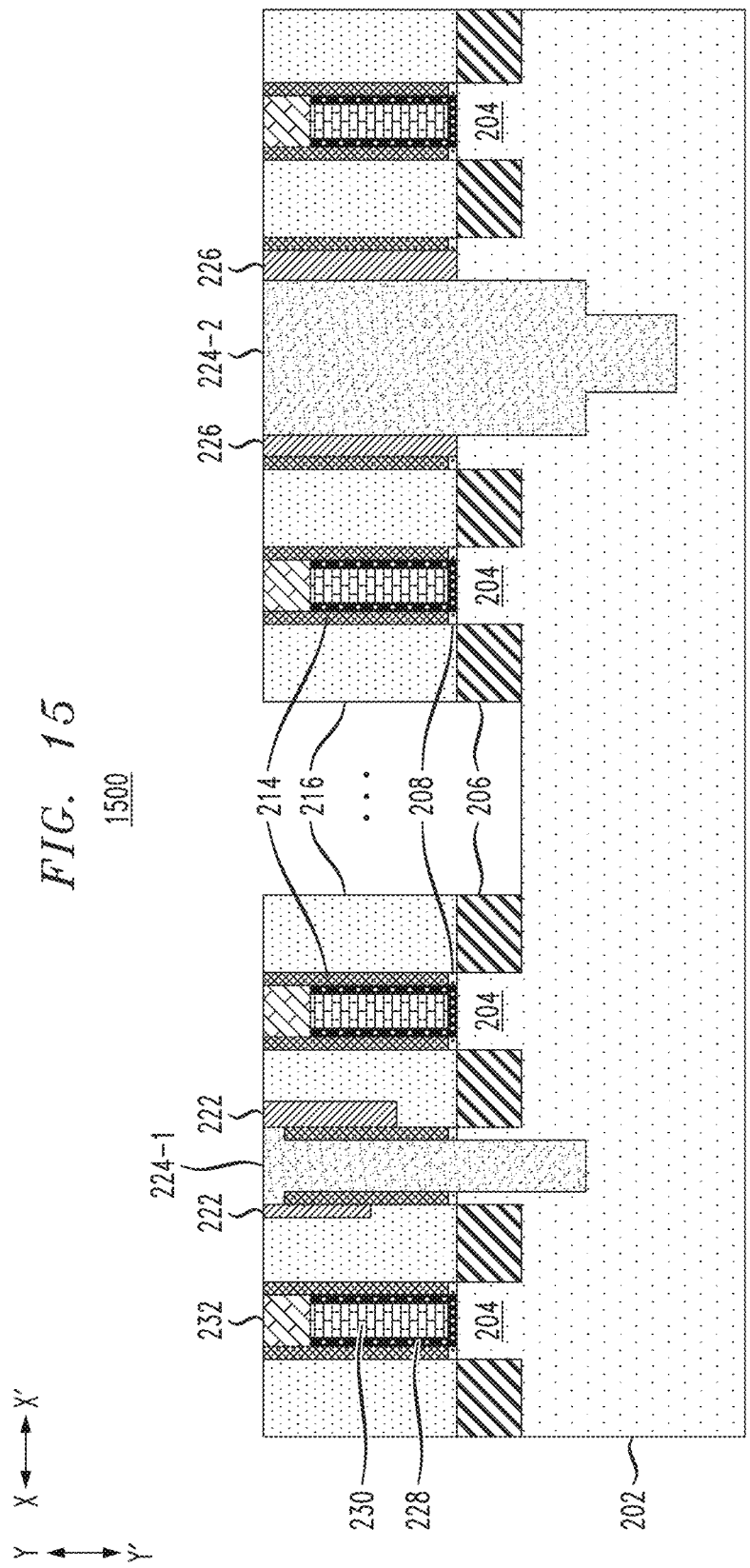
FIG. 15 depicts a side cross-sectional view of the FIG. 14 structure following formation of active gates and gate capping layers, according to an embodiment of the invention.

FIG. 15 shows a side cross-sectional view 1500 of the FIG. 14 structure following formation of active gates (e.g., using a RMG process). The active gates include a gate dielectric layer 228 and a gate conductor layer 230.

The gate dielectric layer 228 may be formed of a high-k dielectric material. Examples of high-k materials include but are not limited to metal oxides such as hafnium oxide ($HfO_2$), hafnium silicon oxide (Hf—Si—O), hafnium silicon oxynitride (HfSiON), lanthanum oxide ($La_2O_3$), lanthanum aluminum oxide ($LaAlO_3$), zirconium oxide ($ZrO_2$), zirconium silicon oxide, zirconium silicon oxynitride, tantalum oxide ($Ta_2O_5$), titanium oxide ($TiO_2$), barium strontium titanium oxide, barium titanium oxide, strontium titanium oxide, yttrium oxide ($Y_2O_3$), aluminum oxide ($Al_2O_3$), lead scandium tantalum oxide, and lead zinc niobate. The high-k material may further include dopants such as lanthanum (La), aluminum (Al), and magnesium (Mg). The gate dielectric layer 228 may have a uniform thickness in the range of 1 nm to 3 nm.

The gate conductor layer 230 may include a metal gate or work function metal (WFM). In some embodiments, the gate conductor layer 230 is formed using ALD or another suitable process. For nFET devices, the WFM for the gate conductor may be titanium (Ti), aluminum (Al), titanium aluminum (TiAl), titanium aluminum carbon (TiAlC), a combination of Ti and Al alloys, a stack which includes a barrier layer (e.g., of titanium nitride (TiN) or another suitable material) followed by one or more of the aforementioned WFM materials, etc. For pFET devices, the WFM for the gate conductor may be TiN, tantalum nitride (TaN), or another suitable material. In some embodiments, the pFET WFM may include a metal stack, where a thicker barrier layer (e.g., of TiN, TaN, etc.) is formed followed by a WFM such as Ti, Al, TiAl, TiAlC, or any combination of Ti and Al alloys. It should be appreciated that various other materials may be used for the gate conductor layer 230 as desired.

A gate capping layer 232 is formed over the gate dielectric 228 and gate conductor 230. The gate capping layer 232 may be formed of a nitride or another suitable material. The gate capping layer 232 may have a height or vertical thickness (in direction Y-Y') in the range of 20 to 30 nm.

The structure of FIG. 15 may be subject to further processing not shown to continue fabrication of FinFETs, such as deposition of one or more additional ILD layers and formation of contacts to the source/drain regions 206 and gate conductor layer 230. Contacts may be formed by patterning openings in the one or more additional ILD layers and deposing a contact material (e.g., tungsten (W) or another suitable material).

In some embodiments, a method of forming a semiconductor structure comprises forming a plurality of fins over a substrate, at least a portion of one or more of the plurality of fins providing one or more channels for one or more FinFETs. The method also comprises forming a plurality of active gate structures over portions of the plurality of fins, forming at least one SDB trench between a first one of the plurality of active gate structures and a second one of the plurality of active gate structures, and forming at least one DDB trench between a third one of the plurality of active gate structures and a fourth one of the plurality of active gate structures. The DDB trench has a stepped height profile in the substrate, the stepped height profile comprising a first depth with a first width and a second depth with a second width, the second depth being less than the first depth, the second width being greater than the first width.

The method may further comprise forming a plurality of sacrificial gate structures over portions of the plurality of fins and the substrate, forming source/drain regions in portions of the plurality of fins exposed by the plurality of sacrificial gate structures, and forming an ILD layer over the source/drain regions surrounding the plurality of sacrificial gate structures.

The method may further comprise patterning at least one mask layer over the ILD layer and the plurality of sacrificial gate structures to provide: at least one SDB opening over a first one of the plurality of sacrificial gate structures; and at least one DDB opening over at least a portion of a second one of the plurality of sacrificial gate structures and at least a portion of a third one of plurality of sacrificial gate structures adjacent the second one of the plurality of sacrificial gate structures. Patterning the at least one mask layer may comprise forming a sacrificial mask layer over the ILD layer and the plurality of sacrificial gate structures and patterning an additional mask layer over the sacrificial mask layer to provide the SDB opening and the DDB opening.

The method may further comprise performing a fin cut to form: the SDB trench in the substrate in the SDB opening; and the DDB trench in the DDB opening, wherein the first width of the stepped height profile of the DDB trench is defined by a space between the second and third sacrificial gate structures, and wherein the second width of the stepped height profile of the DDB trench is defined by the DDB opening.

Each of the plurality of sacrificial gate structures may comprise a dummy oxide layer, a dummy gate layer over the dummy oxide layer, a gate hard mask layer over the dummy gate layer, and gate sidewall spacers adjacent sidewalls of the dummy gate layer and the gate hard mask layer. Forming the ILD layer may comprise depositing an ILD material and planarizing the ILD material to form the ILD layer, wherein planarizing the ILD material removes the gate hard mask layer of each of the plurality of sacrificial gate structures.

The method may further comprise etching exposed portions of the ILD layer: in the SDB opening to remove a first portion of the ILD layer adjacent the first sacrificial gate structure; and in the DDB opening to expose a given one of the source/drain regions disposed between the second and third sacrificial gate structures.

The method may further comprise forming a first dielectric liner in spaces exposed by removal of the first portion of the ILD layer in the SDB opening.

The method may further comprise etching exposed portions of the gate sidewall spacers: in the SDB opening to remove a first portion of the gate sidewall spacers adjacent the first sacrificial gate structure; and in the DDB opening to expose portions of the dummy oxide layers of the second and third sacrificial gate structures.

The method may further comprise etching exposed portions of the dummy gate layers: in the SDB opening to expose the dummy oxide layer of the first sacrificial gate structure; and in the DDB opening to (i) expose portions of the dummy oxide layers of the second and third sacrificial gate structures and (ii) to remove the given source/drain region and a portion of the substrate between the second and third sacrificial gate structures in the DDB opening.

The method may further comprise removing exposed portions of the dummy oxide layers in the SDB opening and the DDB opening, and etching exposed portions of the substrate: to form the SDB trench in the substrate in the SDB opening between the gate sidewalls spacers of the first sacrificial gate structure; and to form the DDB trench in the substrate in the DDB opening.

The method may further comprise removing the sacrificial mask layer and the additional mask layer, forming an insulating dielectric layer in the SDB trench and the DDB trench, removing the dummy gate layers and exposed portions of the dummy oxide layers of the plurality of sacrificial gate structures, and forming a dielectric liner in spaces between the DDB trench and remaining gate sidewall spacers of the second and third sacrificial gate structures.

Forming the plurality of active gate structures may comprise forming a gate dielectric layer over exposed portions of the plurality of fins and on a portion of exposed sidewalls of the gate sidewalls spacers, forming a gate conductor layer formed over the gate dielectric layer, and forming a gate capping layer over the gate dielectric layer and the gate conductor layer.

In some embodiments, a semiconductor structure comprises a substrate and a plurality of fins disposed over the substrate, at least a portion of one or more of the plurality of fins providing one or more channels for one or more FinFETs. The semiconductor structure also comprises a plurality of active gate structures disposed over portions of the plurality of fins, at least one SDB trench between a first one of the plurality of active gate structures and a second one of the plurality of active gate structures, and at least one DDB trench between a third one of the plurality of active gate structures and a fourth one of the plurality of active gate structures. The DDB trench has a stepped height profile in the substrate, the stepped height profile comprising a first depth with a first width and a second depth with a second width, the second depth being less than the first depth, the second width being greater than the first width.

The semiconductor structure may further comprise first gate sidewall spacers having first surfaces adjacent the SDB trench above the substrate and at least a portion of one or more of the plurality of fins, a first dielectric liner disposed adjacent portions of second surfaces of the first gate sidewall spacers, a second dielectric liner having first surfaces disposed adjacent the DDB trench above the substrate and one or more of the plurality of fins, and second gate sidewall spacers adjacent second surfaces of the second dielectric liner.

The SDB trench and the DDB trench may comprise an insulating dielectric material.

In some embodiments, an integrated circuit comprises a FinFET structure comprising a substrate and a plurality of fins disposed over the substrate, at least a portion of one or more of the plurality of fins providing one or more channels for one or more FinFETs. The FinFET structure also comprises a plurality of active gate structures disposed over portions of the plurality of fins, at least one SDB trench between a first one of the plurality of active gate structures and a second one of the plurality of active gate structures, and at least one DDB trench between a third one of the plurality of active gate structures and a fourth one of the plurality of active gate structures. The DDB trench has a stepped height profile in the substrate, the stepped height profile comprising a first depth with a first width and a second depth with a second width, the second depth being less than the first depth, the second width being greater than the first width.

The FinFET structure may further comprise first gate sidewall spacers having first surfaces adjacent the SDB trench above the substrate and at least a portion of one or more of the plurality of fins, a first dielectric liner disposed adjacent portions of second surfaces of the first gate sidewall spacers, a second dielectric liner having first surfaces disposed adjacent the DDB trench above the substrate and one or more of the plurality of fins, and second gate sidewall spacers adjacent second surfaces of the second dielectric liner.

The SDB trench and the DDB trench may comprise an insulating dielectric material.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures will not be repeated for each of the figures. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as ±5%, preferably less than 2% or 1% or less than the stated amount.

Semiconductor devices and methods for forming same in accordance with the above-described techniques can be employed in various applications, hardware, and/or electronic systems. Suitable hardware and systems for implementing embodiments of the invention may include, but are not limited to, sensors an sensing devices, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
a substrate;
a plurality of fins disposed over the substrate, at least a portion of one or more of the plurality of fins providing one or more channels for one or more fin field-effect transistors;
a plurality of active gate structures disposed over portions of the plurality of fins;
at least one single diffusion break trench between a first one of the plurality of active gate structures and a second one of the plurality of active gate structures;
at least one double diffusion break trench between a third one of the plurality of active gate structures and a fourth one of the plurality of active gate structures;
first gate sidewall spacers having first surfaces adjacent the single diffusion break trench;
a first dielectric liner disposed adjacent portions of second surfaces of the first gate sidewall spacers;
a second dielectric liner having first surfaces disposed adjacent the double diffusion break trench; and
second gate sidewall spacers adjacent second surfaces of the second dielectric liner;
wherein the double diffusion break trench has a stepped height profile in the substrate, the stepped height profile comprising a first depth with a first width and a second depth with a second width, the second depth being less than the first depth, the second width being greater than the first width.

2. The semiconductor structure of claim 1, wherein the first gate sidewall spacers are disposed above the substrate and at least a portion of one or more of the plurality of fins.

3. A semiconductor structure, comprising:
a substrate;
a plurality of fins disposed over the substrate, at least a portion of one or more of the plurality of fins providing one or more channels for one or more fin field-effect transistors;
a plurality of active gate structures disposed over portions of the plurality of fins;
at least one single diffusion break trench between a first one of the plurality of active gate structures and a second one of the plurality of active gate structures;
at least one double diffusion break trench between a third one of the plurality of active gate structures and a fourth one of the plurality of active gate structures;
first gate sidewall spacers having first surfaces adjacent the single diffusion break trench above the substrate and at least a portion of one or more of the plurality of fins; and
a first dielectric liner disposed adjacent portions of second surfaces of the first gate sidewall spacers;
wherein a first portion of the first dielectric liner disposed adjacent a first one of the first gate sidewall spacers adjacent a first side of the single diffusion break trench has a third depth, and wherein a second portion of the first dielectric liner disposed adjacent a second one of the first gate sidewall spacers adjacent a second side of the single diffusion break trench has a fourth depth, the fourth depth being different than the third depth.

4. The semiconductor structure of claim 2, wherein the second dielectric liner is disposed above the substrate and one or more of the plurality of fins.

5. The semiconductor structure of claim 1, wherein the first dielectric liner has a first height and the second dielectric liner has a second height, the second height being greater than the first height.

6. The semiconductor structure of claim 1, wherein the first dielectric liner has a first height less than a second height of the first gate sidewall spacers, and wherein the second dielectric liner has a third height greater than a fourth height of the second gate sidewall spacers.

7. The semiconductor structure of claim 1, wherein the plurality of active gate structures comprise:
a gate dielectric layer disposed over the portions of the plurality of fins and on gate sidewall spacers surrounding the plurality of active gate structures;
a gate conductor layer disposed over the gate dielectric layer; and
a gate capping layer disposed over the gate dielectric layer and the gate conductor layer.

8. The semiconductor structure of claim 1, wherein the single diffusion break trench and the double diffusion break trench comprise an insulating dielectric material.

9. The semiconductor structure of claim 1, further comprising source/drain regions in portions of the fins between the plurality of active gate structures.

10. The semiconductor structure of claim 1, wherein the first depth of the double diffusion break trench is greater than a depth of the single diffusion break trench.

11. An integrated circuit comprising:
a fin field-effect transistor structure comprising:
a substrate;

a plurality of fins disposed over the substrate, at least a portion of one or more of the plurality of fins providing one or more channels for one or more fin field-effect transistors;

a plurality of active gate structures disposed over portions of the plurality of fins;

at least one single diffusion break trench between a first one of the plurality of active gate structures and a second one of the plurality of active gate structures; and at least one double diffusion break trench between a third one of the plurality of active gate structures and a fourth one of the plurality of active gate structures;

first gate sidewall spacers having first surfaces adjacent the single diffusion break trench;

a first dielectric liner disposed adjacent portions of second surfaces of the first gate sidewall spacers;

a second dielectric liner having first surfaces disposed adjacent the double diffusion break trench; and second gate sidewall spacers adjacent second surfaces of the second dielectric liner;

wherein the double diffusion break trench has a stepped height profile in the substrate, the stepped height profile comprising a first depth with a first width and a second depth with a second width, the second depth being less than the first depth, the second width being greater than the first width.

12. The integrated circuit of claim 11, wherein the first gate sidewall spacers are disposed above the substrate and at least a portion of one or more of the plurality of fins.

13. The integrated circuit of claim 11, wherein a first portion of the first dielectric liner disposed adjacent a first one of the first gate sidewall spacers adjacent a first side of the single diffusion break trench has a third depth, and wherein a second portion of the first dielectric liner disposed adjacent a second one of the first gate sidewall spacers adjacent a second side of the single diffusion break trench has a fourth depth, the fourth depth being different than the third depth.

14. The integrated circuit of claim 11, wherein the second dielectric liner is disposed above the substrate and one or more of the plurality of fins.

15. The integrated circuit of claim 11, wherein the first dielectric liner has a first height and the second dielectric liner has a second height, the second height being greater than the first height.

16. The integrated circuit of claim 11, wherein the first dielectric liner has a first height less than a second height of the first gate sidewall spacers, and wherein the second dielectric liner has a third height greater than a fourth height of the second gate sidewall spacers.

17. The integrated circuit of claim 11, wherein the plurality of active gate structures comprise:
a gate dielectric layer disposed over the portions of the plurality of fins and on gate sidewall spacers surrounding the plurality of active gate structures;
a gate conductor layer disposed over the gate dielectric layer; and
a gate capping layer disposed over the gate dielectric layer and the gate conductor layer.

18. The integrated circuit of claim 11, wherein the single diffusion break trench and the double diffusion break trench comprise an insulating dielectric material.

19. The integrated circuit of claim 11, further comprising source/drain regions in portions of the fins between the plurality of active gate structures.

20. The integrated circuit of claim 11, wherein the first depth of the double diffusion break trench is greater than a depth of the single diffusion break trench.

* * * * *